United States Patent [19]

Lavene

[11] 4,455,591

[45] Jun. 19, 1984

[54] MEANS AND A METHOD FOR CONVERTING FINISHED ELECTRICAL COMPONENTS WITH TERMINAL LEADS TO ELEMENTS HAVING PLANAR TERMINATIONS

[75] Inventor: Bernard Lavene, Ocean, N.J.

[73] Assignee: Electronic Concepts, Inc., Eatontown, N.J.

[21] Appl. No.: 348,401

[22] Filed: Feb. 3, 1982

[51] Int. Cl.³ .............................................. H01G 1/14
[52] U.S. Cl. ................................................. 361/310
[58] Field of Search ............... 29/25.42; 361/305, 308, 361/309, 310, 408

[56] References Cited

U.S. PATENT DOCUMENTS

| | | |
|---|---|---|
| 1,181,623 | 5/1916 | Van Deventer . |
| 1,537,386 | 5/1925 | Tingley . |
| 2,224,288 | 12/1940 | Chapman ........................ 29/25.42 X |
| 2,935,669 | 5/1950 | Abeel et al. . |
| 3,515,958 | 6/1970 | Claypoole et al. . |
| 3,603,849 | 9/1971 | Kellerman . |
| 3,829,738 | 8/1974 | Makihara . |
| 3,908,102 | 9/1975 | Seike .................................. 200/19 A |
| 4,004,200 | 1/1977 | Johanson ..................... 339/258 R X |
| 4,097,915 | 6/1978 | Locke .................................. 361/433 |
| 4,158,218 | 6/1979 | McLaurin et al. ................. 361/308 |
| 4,241,378 | 12/1980 | Dorrian ............................. 361/305 |
| 4,247,883 | 1/1981 | Thompson et al. ................ 361/433 |
| 4,250,534 | 2/1981 | Brown et al. ....................... 361/272 |

Primary Examiner—Donald A. Griffin
Attorney, Agent, or Firm—Ratner & Prestia

[57] ABSTRACT

Finished electrical components having wire lead terminals are converted to elements having planar terminations by placing end caps or shoes over the ends of an existing component. A finished film capacitor having radial wire leads that is presently on a distributor's shelf, ready for shipment, may be converted to a capacitor for solder reforming by the use of these conversion caps. The capacitor may then be secured in a planar fashion to a substrate.

10 Claims, 6 Drawing Figures

MEANS AND A METHOD FOR CONVERTING FINISHED ELECTRICAL COMPONENTS WITH TERMINAL LEADS TO ELEMENTS HAVING PLANAR TERMINATIONS

BACKGROUND OF THE INVENTION

A. Field of the Invention

This invention relates to planar terminated components and more particularly to a means and a method for converting an existing encapsulated capacitor having terminal leads to one having planar external terminal connections.

B. Description of the Prior Art

Direct mounting of electrical components, such as metallized polyester or metallized polycarbonate capacitors, is particularly useful in thin and thick integrated and hybrid circuitry. In previous attempts to accomplish this, unencapsulated capacitors were often used. Such capacitors required careful handling, and their protruding terminal leads were not strong. In fact, even after they were connected, they could not withstand most military environmental requirements.

Further, since many present day applications required components that could be planar mounted, encapsulated finished components having terminal leads which were already on distributors' shelves could not be utilized.

Also, since such planar connections were usually accomplished by reflow soldering or similar means, it became apparent that what was needed was a component having the strength and versatility of a completed, encapsulated element with terminal leads combined with the advantages of planar external terminal connections.

SUMMARY OF THE INVENTION

It is therefore an object of the present invention to provide a means and a method for converting an existing encapsulated capacitor having terminal leads to one having planar external terminal connections to thereby overcome the heretofore noted disadvantages.

Broadly, according to the present invention, an electrical component is provided having all of the advantages of existing encapsulated capacitors with terminal leads as well as the additional advantages of planar mounting versatility. This is accomplished by taking an existing finished capacitor with terminal leads and applying a pair of end caps to either ends thereof. Thereafter, the excess protruding leads are eliminated and the end caps are welded to the remaining terminal leads.

Thus, a distributor may convert leaded components already on his shelves to planar mounted units. In this way, the distributor need not carry both types, since he could readily convert the existing leaded elements to planar mounted units.

DETAILED DESCRIPTION

It is to be noted that although the present invention will be described in connection with the new smaller metallized film capacitors, the present invention is not limited thereto and is applicable to other encapsulated components in general and the method of their conversion to planar elements.

Figure 1:
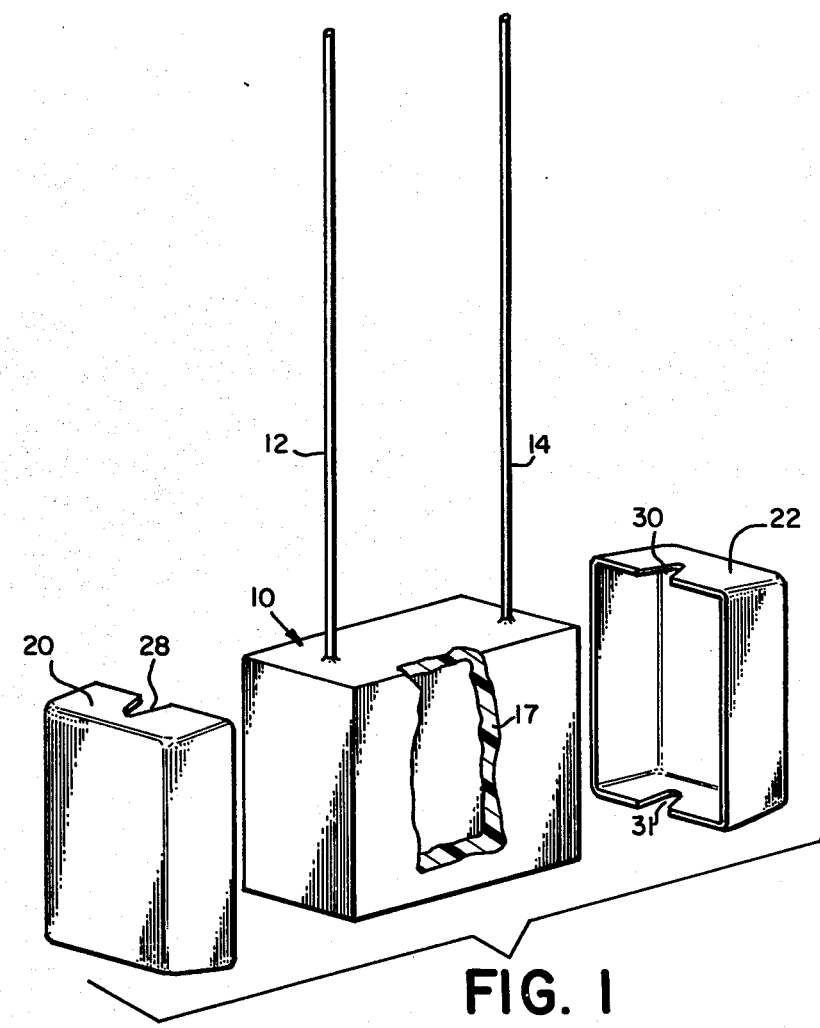
FIG. 1 is an exploded isometric view of the component of the present invention.

Referring to FIG. 1, there is shown an exploded isometric view of the inventive device. The encapsulated finished capacitor 10, having terminal leads 12 and 14, is shown between the metal end caps 20 and 22, which are about to be positioned at opposite ends of the capacitor 10. Each of the end caps 20 and 22 has a pair of V-shaped indentations as shown on end caps 22 at 30 and 31. The bottom V-shaped notch of end cap 20 is not shown in this figure. The reason for the inclusion of a V-shaped notch at both top and bottom of the caps 20 and 22 is for simplicity of positioning and orientation during manufacture of the inventive device. As the caps are placed in position, these V-shaped notches substantially surround the respective lead terminals 12 and 14 of the capacitor 10.

An interior cutaway portion of the epoxy shell casing of the capacitor 10 is illustrated to show a suggested capacitor of the metallized type. The epoxy casing or protective shell 17 of the existing capacitor is illustrated in detail to show its cross section.

Figure 2:
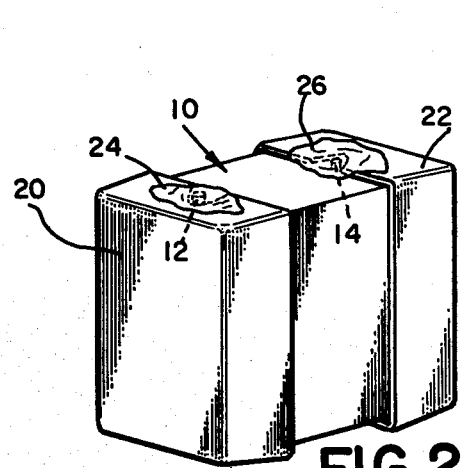
FIG. 2 is an isometric view of the same component with the end caps in place and the terminal leads shortened and attached to the end caps.

FIG. 2 illustrates an isometric view of the completed component. The end caps 20 and 22 are now positioned on and engage opposite ends of the casing 17 of capacitor 10, and they substantially surround lead terminals 12 and 14. The end caps 20 and 22 are then conductively secured to the leads 12 and 14. This is shown at 24 and 26 and is accomplished by welding though any similar securing means may be utilized so long as there is a conductive connection made between end cap and terminal lead. End caps 20 and 22 are held in place on casing 17 by their attachment to leads 12, 14 and by any adhesive effect produced by the heating of the casing.

Figure 3:
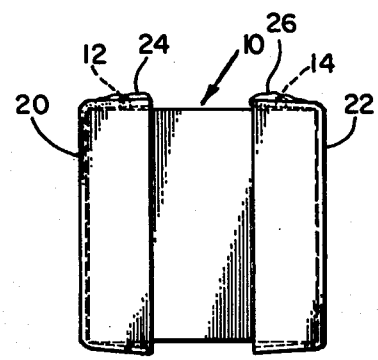
FIG. 3 is a cross-sectional view of FIG. 2 showing the welded beads or attaching means of the inventive device.

FIG. 3 is a cross-sectional view of FIG. 2 and reveals how the end caps 20 and 22 are positioned on the capacitor body 10.

Figure 4:
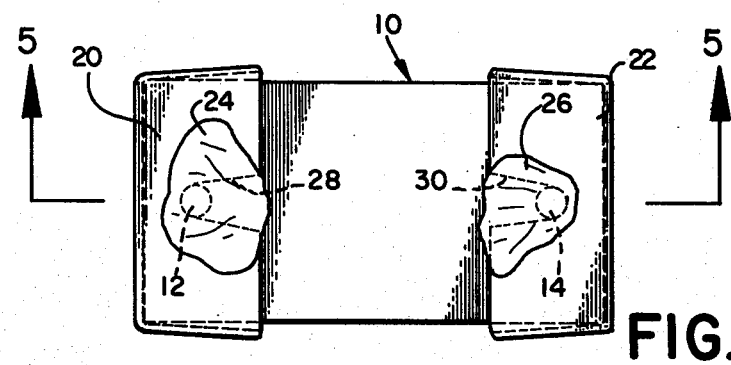
FIG. 4 is a top view of the same device.
Figure 5:
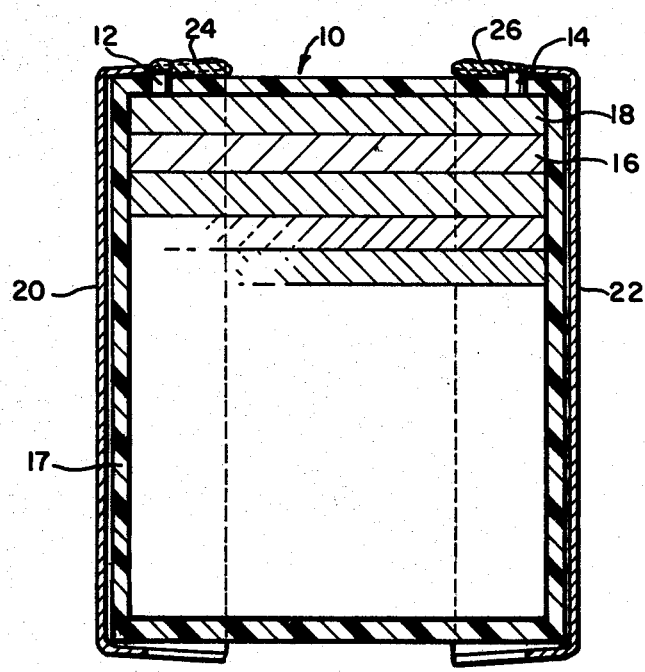
FIG. 5 is a detailed cross-sectional view of FIG. 4 showing the exterior casing of a metallized capacitor.

FIGS. 4 and 5 are more detailed drawings of the present invention. For example, FIG. 4 is a top view of the device and shows the capacitor 10 with the end caps 20 and 22 in position.

The leads 12 and 14 have been secured to the respective end caps 20 and 22 by corresponding welds 24 and 26 at the notched areas 28 and 30 of the end caps.

A cross section of this figure is shown in FIG. 5. It reveals the interior of the capacitor 10 to be of the encapsulated metallized film variety.

The alternate elements of dielectric 16 and metallized portions 18 are illustrated here. As shown, end caps 20 and 22 are only in contact with casing 17 and not with the capacitor element 16, 18 itself. The excess portions of leads 12 and 14 have been removed, that is, the portions of leads 12 and 14 which protrude beyond the top surface of end caps 20 and 22.

Figure 6:
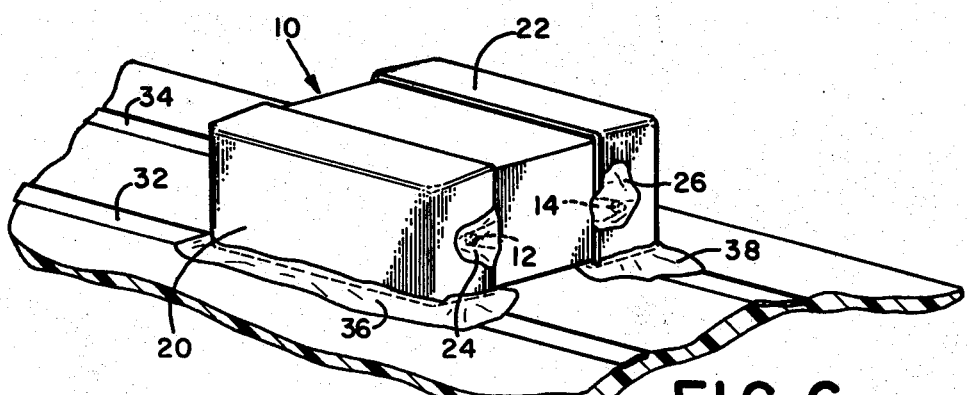
FIG. 6 pictorially illustrates the completed planar capacitor of the present invention mounted upon a substrate in a suggested configuration.

In FIG. 6, there is shown the inventive device in its suggested application. Thus, there is shown the substrate 40 which may be of ceramic material having a parallel pair of conductive strips 32 and 34. As earlier indicated, this configuration may be of the thick film integration circuit variety. The planar leads (end caps), now replacing the radial leads 12 and 14 of the film capacitor 10, are easily attached to the previously soldered strips 32 and 34 by placing the entire substrate 40 and component into a heated environment. At the appropriate temperature, the solder will reflow, and the component will be electrically connected to the substrate 40.

It will be understood that this planar component now possesses all of the other advantages of planar elements. For example, orientation is simplified during manufacture. It is also understood that electrical components, other than capacitors, which have been previously encapsulated and have been terminals, may also be used. Such components may be resistors, ceramic capacitors, or the like. Further, the leads may be differently configured. For example, the leads could be end mounted, in which case, the end caps could have end holds (not shown) rather than V-shaped notches.

Although the present invention has been described with respect to details of certain embodiments thereof, it is not intended that such details be limitations upon the scope of the invention.

What is claimed is:

1. A capacitor for use in solder reflow applications comprising:
   (a) an encapsulated finished capacitor having a capacitor element completely encapsulated within a casing with a first and a second terminal lead extending from the casing;
   (b) a first and a second box-shaped metal end cap individually positioned at opposite ends of the casing and not in contact with the capacitor element, respectively adjacent to and substantially surrounding said first and second terminal leads;
   (c) each of said first and second leads conductively adhesively secured to and terminated at each of the respectively adjacent first and second metal end caps to thereby secure the end caps in place on the casing together with the adhesive effect of the casing with the end caps free of other mechanical coupling to the casing.

2. The capacitor of claim 1, wherein the casing is the protective outer casing of the capacitor, each of the end caps have a first and a second notched portion, on opposing surfaces of the end cap, only one of said notched portions substantially surrounding one of said lead terminals to thereby facilitate orientation during manufacture.

3. The capacitor of claim 2, wherein the first and second notched portions on each of said end caps are V-shaped.

4. The capacitor of claim 1, wherein each of said end caps are rectangularly box-shaped with one side of said box-like rectangle removed to receive the end portion of said finished capacitor.

5. The capacitor of claim 4, wherein the box-shaped rectangle end cap has an opening centrally located in the surface of the side by side end cap opposite said open side to receive a finished capacitor whose terminal leads emanate from the ends thereof.

6. A method for converting a finished completely encapsulated component having terminal leads to a component having end cap terminations for use in solder reflow applications comprising the steps of:
   (a) externally applying a conductive box-shaped end cap to each end of the finished completely encapsulated component housed within a protective casing having terminal leads such that each conductive end cap substantially surrounds one of said terminal leads;
   (b) removing the excess portion of each terminal lead which substantially protrudes beyond the surface of each of said end caps; and
   (c) conductively adhesively securing the remaining portion of each of said terminal leads to the respective end cap in the area of said end cap which substantially surrounds the terminal lead to thereby secure the ends in place together with the adhesive effect of the casing avoiding any other mechanical coupling of end caps to casing.

7. The method as set forth in claim 6, wherein the finished component is a capacitor encapsulated in an expoxy casing.

8. The method as set forth in claim 6, wherein the finished component is a resistor.

9. The method as set forth in claim 6, wherein the finished component is a metallized finished capacitor having a pair of terminal leads both emanating one side of said capacitor.

10. The method as set forth in claim 9, wherein the metallized finished capacitor has a pair of terminal leads, one of which emanates from either end of said metallized capacitor.

* * * * *